(12) United States Patent
Pyeon et al.

(10) Patent No.: US 8,738,879 B2
(45) Date of Patent: *May 27, 2014

(54) INDEPENDENT LINK AND BANK SELECTION

(75) Inventors: Hong Beom Pyeon, Kanata (CA); Hakjune Oh, Kanata (CA); Jin-Ki Kim, Kanata (CA)

(73) Assignee: Conversant Intellectual Property Managment Inc., Ottawa, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 13/608,605

(22) Filed: Sep. 10, 2012

(65) Prior Publication Data

US 2013/0003470 A1 Jan. 3, 2013

Related U.S. Application Data

(63) Continuation of application No. 13/077,122, filed on Mar. 31, 2011, now Pat. No. 8,285,960, which is a continuation of application No. 12/757,406, filed on Apr. 9, 2010, now Pat. No. 7,945,755, which is a continuation of application No. 11/643,850, filed on Dec. 22, 2006, now Pat. No. 7,747,833, which is a continuation-in-part of application No. 11/324,023, filed on Dec. 30, 2005, now Pat. No. 7,652,922.

(60) Provisional application No. 60/722,368, filed on Sep. 30, 2005.

(51) Int. Cl.
  *G06F 12/00* (2006.01)
  *G06F 13/40* (2006.01)

(52) U.S. Cl.
  CPC ................................. *G06F 13/4022* (2013.01)
  USPC .......................................................... 711/168

(58) Field of Classification Search
  CPC ................................................... G06F 13/4022
  See application file for complete search history.

(56) References Cited

U.S. PATENT DOCUMENTS

| 4,174,536 A | 11/1979 | Misunas et al. |
| 4,617,566 A | 10/1986 | Diamond |

(Continued)

FOREIGN PATENT DOCUMENTS

| EP | 1267269 A2 | 12/2002 |
| EP | 1457993 | 9/2004 |

(Continued)

OTHER PUBLICATIONS

Samsung Electronics Co. Ltd, "256M×8 Bit / 128 M×16 Bit / 512M×8 Bit NAND Flash Memory", K9K4G08U1M, May 6, 2005, pp. 1-41.

(Continued)

*Primary Examiner* — Hiep Nguyen
(74) *Attorney, Agent, or Firm* — Shin Hung; Borden Ladner Gervais LLP

(57) ABSTRACT

Provided is a memory system that has a plurality of memory banks and a plurality of link controllers. For each memory bank, there is first switching logic for receiving output for each link controller, and for passing on the output of only one of the link controllers to the memory bank. For each link controller, there is second switching logic for receiving an output of each memory bank, and for passing on the output of only one of the memory banks to the link controller. According to an embodiment of the invention, there is switch controller logic for controlling operation of both the first switching logic and the second switching logic to prevent simultaneous or overlapping access by multiple link controllers to the same memory bank, and for preventing simultaneous or overlapping access to multiple banks by the same link controller.

15 Claims, 13 Drawing Sheets

(56) References Cited

U.S. PATENT DOCUMENTS

| | | |
|---|---|---|
| 4,714,536 A | 12/1987 | Freeman et al. |
| 4,733,376 A | 3/1988 | Ogawa |
| 4,796,231 A | 1/1989 | Pinkham |
| 4,899,316 A | 2/1990 | Nagami |
| 4,930,066 A | 5/1990 | Yokota |
| 5,038,299 A | 8/1991 | Maeda |
| 5,126,808 A | 6/1992 | Montalvo et al. |
| 5,132,635 A | 7/1992 | Kennedy |
| 5,136,292 A | 8/1992 | Ishida |
| 5,175,819 A | 12/1992 | Le Ngoc et al. |
| 5,204,669 A | 4/1993 | Dorfe et al. |
| 5,243,703 A | 9/1993 | Farmwald et al. |
| 5,280,539 A | 1/1994 | Yeom et al. |
| 5,319,598 A | 6/1994 | Aralis et al. |
| 5,365,484 A | 11/1994 | Cleveland et al. |
| 5,386,511 A | 1/1995 | Murata et al. |
| 5,404,460 A | 4/1995 | Thomsen et al. |
| 5,430,859 A | 7/1995 | Norman et al. |
| 5,440,694 A | 8/1995 | Nakajima |
| 5,452,259 A | 9/1995 | McLaury |
| 5,473,563 A | 12/1995 | Suh et al. |
| 5,473,566 A | 12/1995 | Rao |
| 5,473,577 A | 12/1995 | Miyake et al. |
| 5,475,854 A | 12/1995 | Thomsen et al. |
| 5,596,724 A | 1/1997 | Mullins et al. |
| 5,602,780 A | 2/1997 | Diem et al. |
| 5,636,342 A | 6/1997 | Jeffries |
| 5,659,711 A * | 8/1997 | Sugita .................... 711/144 |
| 5,671,178 A | 9/1997 | Park et al. |
| 5,721,840 A | 2/1998 | Soga |
| 5,729,683 A | 3/1998 | Le et al. |
| 5,740,379 A | 4/1998 | Hartwig |
| 5,761,146 A | 6/1998 | Yoo et al. |
| 5,771,199 A | 6/1998 | Lee |
| 5,778,419 A | 7/1998 | Hansen et al. |
| 5,802,006 A | 9/1998 | Ohta |
| 5,802,399 A | 9/1998 | Yumoto et al. |
| 5,806,070 A | 9/1998 | Norman et al. |
| 5,818,785 A | 10/1998 | Ohshima |
| 5,828,899 A | 10/1998 | Richard et al. |
| 5,835,935 A | 11/1998 | Estakhri et al. |
| 5,859,809 A | 1/1999 | Kim |
| 5,872,994 A | 2/1999 | Akiyama et al. |
| 5,896,400 A | 4/1999 | Roohparvar et al. |
| 5,900,021 A | 5/1999 | Tiede et al. |
| 5,937,425 A | 8/1999 | Ban |
| 5,941,974 A | 8/1999 | Babin |
| 5,959,930 A | 9/1999 | Sakurai |
| 5,995,417 A | 11/1999 | Chen et al. |
| 6,002,638 A | 12/1999 | John |
| 6,016,270 A | 1/2000 | Thummalapally et al. |
| 6,075,743 A | 6/2000 | Barth et al. |
| 6,085,290 A | 7/2000 | Smith et al. |
| 6,091,660 A | 7/2000 | Sasaki et al. |
| 6,107,658 A | 8/2000 | Itoh et al. |
| 6,144,576 A | 11/2000 | Leddige et al. |
| 6,148,363 A | 11/2000 | Lofgren et al. |
| 6,148,364 A | 11/2000 | Srinivasan et al. |
| 6,178,135 B1 | 1/2001 | Kang |
| 6,216,178 B1 | 4/2001 | Stracovsky et al. |
| 6,282,505 B1 | 8/2001 | Hanawa et al. |
| 6,304,921 B1 | 10/2001 | Rooke |
| 6,317,350 B1 | 11/2001 | Pereira et al. |
| 6,317,352 B1 | 11/2001 | Halbert et al. |
| 6,317,812 B1 | 11/2001 | Lofgren et al. |
| 6,356,487 B1 | 3/2002 | Merritt |
| 6,438,064 B2 | 8/2002 | Ooishi |
| 6,442,098 B1 | 8/2002 | Kengeri |
| 6,453,365 B1 | 9/2002 | Habot |
| 6,493,347 B2 | 12/2002 | Sindhu et al. |
| 6,535,948 B1 | 3/2003 | Wheeler et al. |
| 6,584,303 B1 | 6/2003 | Kingswood et al. |
| 6,594,183 B1 | 7/2003 | Lofgren et al. |
| 6,601,199 B1 | 7/2003 | Fukuda et al. |
| 6,611,466 B2 | 8/2003 | Lee et al. |
| 6,658,509 B1 | 12/2003 | Bonella et al. |
| 6,658,582 B1 | 12/2003 | Han |
| 6,680,904 B1 | 1/2004 | Kaplan et al. |
| 6,715,044 B2 | 3/2004 | Lofgren et al. |
| 6,732,221 B2 | 5/2004 | Ban |
| 6,754,807 B1 | 6/2004 | Parthasarathy et al. |
| 6,757,761 B1 | 6/2004 | Smith et al. |
| 6,763,426 B1 | 7/2004 | James et al. |
| 6,807,103 B2 | 10/2004 | Calvaleri et al. |
| 6,816,933 B1 | 11/2004 | Andreas |
| 6,850,443 B2 | 2/2005 | Lofgren et al. |
| 6,853,557 B1 | 2/2005 | Haba et al. |
| 6,853,573 B2 | 2/2005 | Kim et al. |
| 6,906,978 B2 | 6/2005 | Elzur et al. |
| 6,914,901 B1 | 7/2005 | Hann et al. |
| 6,928,501 B2 | 8/2005 | Andreas et al. |
| 6,944,697 B2 | 9/2005 | Andreas |
| 6,950,325 B1 | 9/2005 | Chen |
| 6,967,874 B2 | 11/2005 | Hosono |
| 6,996,644 B2 | 2/2006 | Schoch et al. |
| 7,031,221 B2 | 4/2006 | Mooney et al. |
| 7,073,022 B2 | 7/2006 | El-Batal et al. |
| 7,117,291 B2 | 10/2006 | Mattausch et al. |
| 7,130,958 B2 | 10/2006 | Chou et al. |
| 7,652,922 B2 | 1/2010 | Kim et al. |
| 7,747,833 B2 | 6/2010 | Pyeon et al. |
| 7,945,755 B2 | 5/2011 | Pyeon et al. |
| 8,285,960 B2 * | 10/2012 | Pyeon et al. .................... 711/168 |
| 2002/0188781 A1 | 12/2002 | Schoch et al. |
| 2003/0221061 A1 | 11/2003 | El-Batal et al. |
| 2004/0001380 A1 | 1/2004 | Becca et al. |
| 2004/0019736 A1 | 1/2004 | Kim et al. |
| 2004/0024960 A1 | 2/2004 | King et al. |
| 2004/0039854 A1 | 2/2004 | Estakhri et al. |
| 2004/0148482 A1 | 7/2004 | Grundy et al. |
| 2004/0199721 A1 | 10/2004 | Chen |
| 2004/0230738 A1 | 11/2004 | Lim et al. |
| 2005/0160218 A1 | 7/2005 | See et al. |
| 2005/0166006 A1 | 7/2005 | Talbot et al. |
| 2005/0213421 A1 | 9/2005 | Polizzi et al. |
| 2005/0273539 A1 | 12/2005 | Yamamoto |
| 2006/0050594 A1 | 3/2006 | Park |
| 2006/0198202 A1 | 9/2006 | Erez |
| 2008/0049505 A1 | 2/2008 | Kim et al. |
| 2011/0179245 A1 | 7/2011 | Pyeon et al. |

FOREIGN PATENT DOCUMENTS

| | | |
|---|---|---|
| JP | 01200447 | 8/1989 |
| JP | 02136945 | 5/1990 |
| JP | 07319755 | 12/1995 |
| JP | 08221319 | 8/1996 |
| JP | 09186584 | 7/1997 |
| JP | 1097464 | 4/1998 |
| JP | 10116064 A | 5/1998 |
| JP | 2000315185 | 11/2000 |
| JP | 2001156621 A | 6/2001 |
| JP | 2002133867 | 5/2002 |
| JP | 2002236611 | 8/2002 |
| JP | 2003036681 | 2/2003 |
| JP | 2003263363 | 9/2003 |
| JP | 20032663363 | 9/2003 |
| JP | 2004242332 | 8/2004 |
| JP | 2005004895 | 1/2005 |
| JP | 2005025473 | 1/2005 |
| JP | 2006260124 | 9/2006 |
| JP | 2006260127 | 9/2006 |
| WO | 0169411 A2 | 9/2001 |
| WO | 2005069150 | 7/2005 |

OTHER PUBLICATIONS

Toshiba, "2GBIT (256M×8 Bits) CMOS NAND E2PROM", TH58NVG1S3AFT05, May 19, 2003, pp. 1-32.

Amtel Corp., "High Speed Small Sectored SPI Flash Memory", pp. 1-22, 2006.

64 Megabit CMOS 3.0 Volt Flash Memory with 50MHz SPI.

(56) References Cited

OTHER PUBLICATIONS

Gjessing, S., et al., "RamLink: A High-Bandwidth Point-to-Point Memory Architecture", Proceedings CompCom 1992, IEEE 0-8186-2655-0/92, pp. 328-331, Feb. 24-28, 1992.
Gjessing, S., et al., "Performance of the RamLink Memory Architecture", Proceedings of the Twenty-Seventh Annual Hawaii International Conference on System Sciences, IEEE 1060-3425/94, pp. 154-162, Jan. 1994.
Gjessing, S., et al., "A RAM Link for High Speed", Special Report/Memory, IEEE Spectrum, pp. 52-53, Oct. 1992.
Diamond, S.L., "SyncLink: High: High-speed DRAM for the Future", Micro Standards, IEEE Micro, pp. 74-75, Dec. 1996.
Samsung Electronics, "DDR2 Fully Buffered DIMM 240pin FBDIMMS based on 512Mb C-die" Rev. 1.3, Sep. 2006, pp. 1-32, Sep. 2006.
"HyperTransport TM I/O Link Specification", Revision 3.00, Document No. HTC20051222-0046-0008, Hypertransport Technology Consortium, pp. 1-428, Apr. 2006.
"2 Mbit, Low Voltage, Serial Flash Memory With 40 MHz SPI Bus Interface", Silicon Storage Technology, Aug. 2005, pp. 1-40.
"The I2C-Bus Specification," Version 2.1, Philips Semiconductors, Jan. 2000, pp. 1-46.
Atmel, "8-megabit 2.5-volt Only or 2.7-volt Only DataFlash®," Technical Specification, Atmel, Rev. 2225H-DFLSH (2004).
Jung, T. et al., "A 117-mm2 3.3-V Only 128-Mb Multilevel NAND Flash Memory for Mass Storage Applications," IEEE Journal of Solid-State Circuits, vol. 31, No. 11, Nov. 1996, pp. 1575-1583.
Kim, et al. "A 120-mm2 64-Mb NAND Flash Memory Archieving 180 ns/Byte Effective Program Speed," IEEE Journal of Solid-State Circuits, vol. 32, No. 5, May 1977, pp. 670-680.
Toshiba MOS Digital Integrated Circuit Silicon Gate CMOS, TH58NVG1S3AFT05, Toshiba Corporation, May 19, 2003, pp. 1-32.
European Patent Application No. 06790770.9 Search Report dated Sep. 16, 2008.
64 Megabit CMOS 3.0 Volt Flash Memory with 50MHz SPI, Aug. 2006.
King, et al., "Communicating with Daisy Chained MCP42XXX Digital Potentiometers", Microchip AN747, pp. 1-8, 2001.
Intel Corporation, "Intel® Advanced+ Boot Block Flash Memory (C3)", May 2005, pp. 1-72.
M-Systems Flash Disk Pioneers Ltd., "DiskOnChip H1 4Gb (512MByte) and 8Gb (1 GByte) High Capacity Flash Disk with NAND and x2 Technology", Data Sheet, Rev. 0.5 (Preliminary), pp. 1-66, 2005.
Tal, A., "Guidelines for Integrating DiskOnChip in a Host System", AP-DOC-1004, Rev. 1.0, M-Systems Flash Pioneers Ltd., pp. 1-15, 2004.
Samsung Electronics Co. Ltd, OneNAND4G(KFW4G16Q2M-DEB6), OneNAND2G(KFH2G16Q2M-DEB6), OneNAND1G(KFW1G16Q2M-DEB6) Flash Memory, OneNAND™ Specification Ver. 1.2, pp. 1-125, Dec. 23, 2005.
Kennedy, J., et al., "A 2Gb/s Point-to-Point Heterogeneous Voltage Capable DRAM Interface for Capacity-Scalable Memory Subsystems", ISSCC 2004/Session 1/DRAM/11.8, IEEE International Solid-State Circuits Conference, Feb. 15-19, 2004, vol. 1, pp. 214-523.
Kim, Jae-Kwan, et al., "A 3.6Gb/s/pin Simultaneous Bidirectional (SBD) I/O Interface for High-Speed DRAM", ISSCC 2004/Session 22/DSL and Multi-Gb/s I/O 22.7, IEEE International Solid-State Circuits Conference Feb. 15-19, 2004, vol. 1, pp. 414-415.
"HyperTransport TM I/O Link Specification", Revision 2.00, Document No. HTC20031217-0036-00, Hypertransport Technology Consortium, pp. 1-325, 2001.
"IEEE Standard for High-Bandwidth Memory Interface Based on Scalable Coherent Interface (SCI) Signaling Technology (RamLink)", IEEE Std. 1596.4-1996, The Institute of Electrical Electronics Engineers, Inc., pp. i-91, (Mar. 1996).
Oshima, et al., "High-Speed Memory Architectures for Multimedia Applications", Circuits & Devices, IEEE 8755-3996/97, pp. 8-13, Jan. 1997.

* cited by examiner

Truth Table 1 of the logic ('304')

| Link0 | | Link1 | | Link_id | outputs | |
|---|---|---|---|---|---|---|
| Bka<0> | Bka<1> | Bkb<0> | Bkb<1> | | aa0 | aa1 |
| 0 | 0 | 0 | 0 | 0 | 0 | 0 |
| 1 | 0 | 1 | 0 | 0 | Hold | 1 |
| 0 | 1 | 0 | 1 | 0 | 0 | Hold |
| 1 | 0 | 0 | 0 | 0 | 1 | 0 |
| 0 | 1 | 0 | 0 | 0 | 0 | 0 |
| 0 | 0 | 1 | 0 | 0 | 0 | 1 |
| 0 | 0 | 0 | 1 | 0 | 0 | 0 |
| 1 | 1 | 0 | 0 | 0 | Hold | Hold |
| 0 | 0 | 1 | 1 | 0 | Hold | Hold |
| 0 | 0 | 0 | 0 | 1 | 0 | 0 |
| 1 | 0 | 1 | 0 | 1 | Hold | 0 |
| 0 | 1 | 0 | 1 | 1 | 1 | Hold |
| 1 | 0 | 0 | 0 | 1 | 0 | 0 |
| 0 | 1 | 0 | 0 | 1 | 1 | 0 |
| 0 | 0 | 1 | 0 | 1 | 0 | 0 |
| 0 | 0 | 0 | 1 | 1 | 0 | 1 |
| 1 | 1 | 0 | 0 | 1 | Hold | Hold |
| 0 | 0 | 1 | 1 | 1 | Hold | Hold |

Rows 1300: first 9 data rows. Rows 1302: last 9 data rows.

* 'single_link' = 0 (Two link system case)

FIG. 13

Truth Table 2 of the logic ('304')

| Link0 | | Link1 | | Link_id | outputs | |
|---|---|---|---|---|---|---|
| Bka<0> | Bka<1> | Bkb<0> | Bkb<1> | | aa0 | aa1 |
| 0 | 0 | Fixed '0' | Fixed '0' | 0 | 0 | 0 |
| 1 | 0 | Fixed '0' | Fixed '0' | 0 | 1 | 0 |
| 0 | 1 | Fixed '0' | Fixed '0' | 0 | 0 | 0 |
| 1 | 1 | Fixed '0' | Fixed '0' | 0 | Hold | Hold |
| 0 | 0 | Fixed '0' | Fixed '0' | 1 | 0 | 0 |
| 1 | 0 | Fixed '0' | Fixed '0' | 1 | 0 | 0 |
| 0 | 1 | Fixed '0' | Fixed '0' | 1 | 1 | 0 |
| 1 | 1 | Fixed '0' | Fixed 0' | 1 | Hold | Hold |

* 'single_link' = 1 (Single link system case)

FIG. 14

INDEPENDENT LINK AND BANK SELECTION

CROSS REFERENCE TO RELATED APPLICATIONS

This application is a continuation of U.S. patent application Ser. No. 13/077,122, filed Mar. 31, 2011, which is a continuation of U.S. patent application Ser. No. 12/757,406 filed on Apr. 9, 2010, now U.S. Pat. No. 7,945,755 which issued on May 17, 2011, which is a continuation of U.S. patent application Ser. No. 11/643,850 filed Dec. 22, 2006, now U.S. Pat. No. 7,747,833 which issued on Jun. 29, 2010, which is a continuation-in-part of U.S. patent application Ser. No. 11/324,023 filed Dec. 30, 2005 entitled "Multiple Independent Link Serial Memory", which claims the benefit of U.S. Provisional Application No. 60/722,368 filed Sep. 30, 2005, the contents of each of which is entirely incorporated herein by reference.

FIELD OF THE INVENTION

The Invention relates to memory systems with multiple links and multiple memory banks.

BACKGROUND OF THE INVENTION

Current consumer electronic devices use memory devices. For example, mobile electronic devices such as digital cameras, portable digital assistants, portable audio/video players and mobile terminals continue to require mass storage memories, preferably non-volatile memory with ever increasing capacities and speed capabilities. Non-volatile memory and hard-disk drives are preferred since data is retained in the absence of power, thus extending battery life.

While existing memory devices operate at speeds sufficient for many current consumer electronic devices, such memory devices may not be adequate for use in future electronic devices and other devices where high data rates are desired. For example, a mobile multimedia device that records high definition moving pictures is likely to require a memory module with a greater programming throughput than one with current memory technology. Unfortunately, there is a problem with signal quality at such high frequencies, which sets a practical limitation on the operating frequency of the memory. The memory communicates with other components using a set of parallel input/output (I/O) pins, the number of which is implementation specific. The I/O pins receive command instructions and input data and provide output data. This is commonly known as a parallel interface. High speed operation may cause communication degrading effects such as cross-talk, signal skew and signal attenuation, for example, which degrades signal quality.

In order to incorporate higher density and faster operation on system boards, there are two design techniques: serial interconnection configurations and parallel interconnection configurations such as multi-drops. These design techniques may be used to overcome the density issue that determines the cost and operating efficiency of memory swapping between a hard disk and a memory system. However, multi-drop configurations have a shortcoming relative to the serial interconnection configurations. For example, if the number of drops in a multi-drop memory system increases, then as a result of loading effect of each pin, delay time also increases so that the total performance of the multi-drop memory system is degraded. This is due to the wire resistor-capacitor loading and the pin capacitance of the memory device. A serial link in a device such as a memory device may utilize a single pin input that receives all address, command, and data serially. The serial link may provide a serial interconnection configuration to control command bits, address bits, and data bits effectively through the configuration. The devices in the configuration may be memory devices, for example, dynamic random access memories (DRAMs), static random access memories (SRAMs) and Flash memories.

SUMMARY OF THE INVENTION

Methods and systems are provided for use in a memory system with multiple memory banks and multiple links. The systems allow read and write access from any of the links to any of the banks, but circuitry is provided to prevent invalid access attempts. There is an invalid access attempt when there is simultaneous or overlapping read or write access to the same bank from multiple links. There is an invalid access attempt when there is simultaneous or overlapping read or write access to multiple banks from the same link. Some implementations feature a common circuitry that is used to perform switching for every link, thereby simplifying manufacture. With such implementations, each instance of the switching circuitry is configured to function in a particular manner that reflects its position within the overall system.

According to one broad aspect, the invention provides a memory system comprising: a plurality of memory banks; a plurality of link controllers each link controller having at least one input for receiving control and data and having at least one output for outputting the data; for each memory bank, first switching logic for receiving the at least one output for each link controller, and for passing on the at least one output of only one of the link controllers to the memory bank; for each link controller, second switching logic for receiving an output of each memory bank, and for passing on the output of only one of the memory banks to the link controller; and switch controller logic for controlling operation of both the first switching logic and the second switching logic to prevent simultaneous or overlapping access by multiple link controllers to the same memory bank, and for preventing simultaneous or overlapping access to multiple banks by the same link controller.

In some embodiments, the first switching logic comprises a plurality of switching elements for a corresponding plurality of outputs of each of the link controllers.

In some embodiments, the second switching logic comprises a single switching element for receiving a serial output from each of the memory banks.

In some embodiments, the plurality of memory banks consist of two memory banks and the plurality of link controllers consist of two link controllers.

In some embodiments, the switch controller logic comprises: a respective switch controller for each memory bank.

In some embodiments, the switch controllers have substantially identical circuit implementations, wherein each switch controller comprises: link recognition logic for receiving an instruction that the switch controller is to operate according to a selected one of a plurality of possible positions for the switch controller in the system.

In some embodiments, the plurality of memory banks consist of a first memory bank and a second memory bank and the switch controller logic consists of a first link controller and a second link controller, and wherein the plurality of possible positions for the switch controller in the system comprises: a first position in which the switch controller controls the first switching logic for the first bank and controls the second switching logic for the first link controller; and a second position in which the switch controller controls the first switching logic for the second bank and controls the second switching logic for the second link controller.

In some embodiments, the memory system further comprises: an input for selecting single link operation; wherein upon assertion a single link operation through said input, the memory system operates as if there is only one link controller.

In some embodiments, the memory system further comprises: invalid check logic for receiving bank selection outputs from each of the link controllers and for determining if there is simultaneous or overlapping access to multiple banks by the same link controller, and if so generating an invalidity signal.

In some embodiments, each switch controller further comprises: a hold circuit for holding previous control outputs in the event of simultaneous or overlapping access to multiple banks by the same link controller and in the event of simultaneous or overlapping access by multiple links to the same bank.

In some embodiments, each switch controller is operable to generate outputs comprising: link bank select signals for selecting which link outputs that are to be passed on to the bank; and bank select signals for selecting which bank outputs are to be passed on to the link controller.

In some embodiments, each link controller comprises: an input buffer for receiving incoming command and data; serial to parallel register for converting incoming command and data to parallel form; and command interpreter control logic for interpreting incoming commands.

In some embodiments, each link controller is operable to output bank select signals for the switch controller logic.

According to another broad aspect, the invention provides a method comprising: receiving a plurality of inputs; outputting a plurality of outputs; selectably passing signals received on the plurality of inputs to memory bank inputs of a plurality of memory banks; selectably passing signals received from memory bank outputs to the plurality of outputs; and controlling the selectably passing signals received on the plurality of inputs to memory bank inputs and the selectably passing signals received from memory bank outputs to the plurality of outputs to prevent simultaneous or overlapping access from multiple inputs to the same memory bank, and to prevent simultaneous or overlapping output from multiple banks to the same output.

In some embodiments, selectably passing signals received on the plurality of inputs to memory bank inputs of a plurality of memory banks comprises: for a given access from a given input of the plurality of inputs to a given memory bank of the plurality of memory banks, connecting the given memory bank to receive signals from the given input.

In some embodiments, the method selectably passing signals received from memory bank outputs to the plurality of outputs comprises: for a given memory bank and a given bank, connecting the output of given memory bank to send signals towards the given output.

In some embodiments, the controlling is performed by a plurality of identical switch controllers, the method further comprising: configuring each of the plurality of identical switch controllers to behave in a manner specific to their position within an overall memory system.

In some embodiments, the method further comprises: upon occurrence of an invalid access attempt, either simultaneous or overlapping access from multiple inputs to the same memory bank or simultaneous or overlapping output from multiple banks to the same output comprises, maintaining a previous access state.

In some embodiments, the method further comprises: detecting invalid access attempts by examining bank select signals forming part of each of the plurality of inputs.

In some embodiments, the plurality of inputs and the plurality of outputs comprise a respective at least one input and a respective at least one output for each of a plurality of link controllers.

BRIEF DESCRIPTION OF THE DRAWINGS

Embodiments of the present invention will now be described, by way of example only, with reference to the attached Figures, wherein:

FIG. 13 is a truth table of part of the logic of FIG. 12 while operating in a two link mode; and FIG. 14 is a truth table of part of the logic of FIG. 12 while operating in a single link mode.

DETAILED DESCRIPTION

Figure 1:
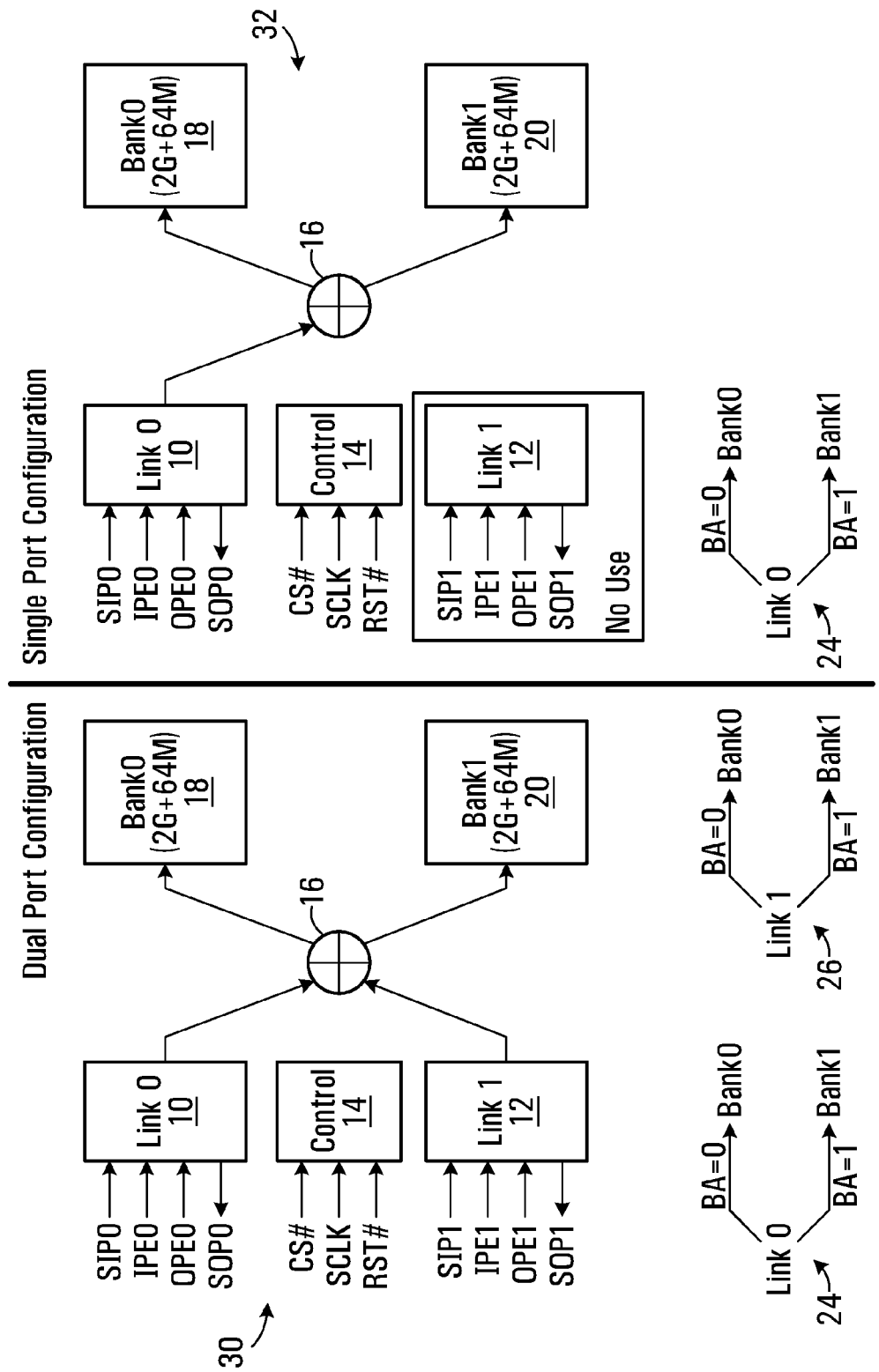
FIG. 1 is a block diagram of a multiple independent serial link memory system.

An MISL (Multiple Independent Serial Link) memory system has a set of links and a set of memory banks, and has a feature that enables accessing any bank from any link port. Referring to FIG. 1, shown is a conceptual block diagram of two MISL memory systems. A first example is generally indicated at 30 and depicts a dual port configuration. There are two links, Link0 10, and link1 12, and there are two banks, Bank0 18 and Bank1 20. There is switching logic 16 interconnecting the links 10,12 and the banks 18,20. Control logic is indicated at 14. The switching logic 16 can interconnect Link0 10 to either of Bank0 18 or Bank1 20 as indicated at 24. Similarly, the switching logic 16 can interconnect Link1 12 to either of Bank0 18 or Bank1 20 as indicated at 26. A single port configuration is indicated at 32. This is generally the same as the dual port configuration 30 except the second link Link1 12 is not used.

To deal with the case of the dual link configuration of MISL described above, circuits are provided that ensure that the two link ports can access the two banks for read and write operations so as to prevent invalid access conditions, such as simultaneous access to one bank from both links. Control signals and data use a path determined by a bank address and the accessed link port for the accessed bank.

In the illustrated example, there are two links 10,12 and two banks 18,20. Subsequent examples also assume that there are two banks and two links. However, more generally, there may be any plural number of links and any plural number of banks. It is to be appreciated that variations and modifications of the features disclosed herein may be contemplated for implementations employing any appropriate number of links and any appropriate number of banks.

Embodiments of the invention described below support the following features:

1. prevention of simultaneous access to the same bank from multiple link ports;
2. single link access as an optional feature;
3. short switch path from link control to bank control block;
4. same logic implementation for each link control block;
5. previous bank access is maintained when the same bank is subsequently accessed from different link port; and
6. separate logic for link to bank access (write and control signals) and bank to link access (read data).

However, it is to be understood that some implementations might support only a subset of these features. More generally, implementations may support any number of these features.

Figure 2:
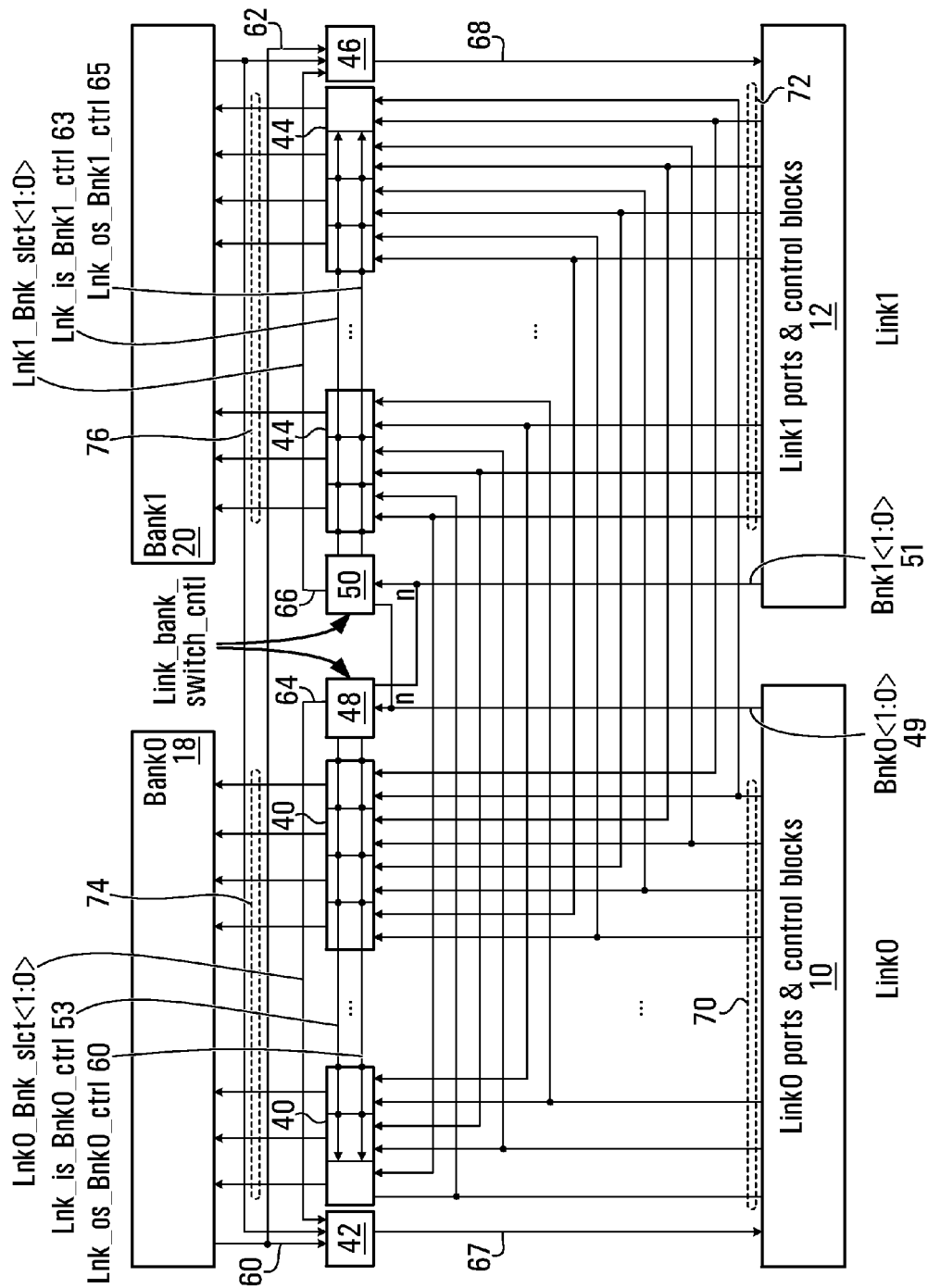
FIG. 2 is a detailed block diagram showing control and data signalling for a multiple independent serial link memory system.

FIG. 2 shows an example of the connections between links and banks with several switches that corresponds with the two link, two bank example of FIG. 1. In this example, two banks 18,20 are connected to two independent links Link0 10 and Link1 12 through switches 40,42,44,46 under control of switch controllers 48,50.

The connections illustrated in FIG. 2 include the following for control:

a control input Bnk0<1:0> 49 connected as an input to switch controllers 48,50 from Link0 10 for functioning as a bank select control;

a Lnk_is_Bnk0_ctrl_enable 53 from switch controller 48 to switch 40 that enables control, address and data from Link0 to be applied to Bank0;

a Lnk_os_Bnk0_ctrl_enable 60 from switch controller 48 to switch 40 that enables control, address and data from link1 to be applied to Bank0;

a Lnk0_Bnk_slct<1:0> output 64 from switch controller 48 to switch 42 this is used to select a bank when read related operation is performed from page buffer to link logic block for Link0;

a control input Bnk1<1:0> 51 connected as an input to switch controllers 48,50 from Link1 12 for functioning as a bank select control;

a Lnk_is_Bnk1_ctrl_enable 63 from switch controller 50 to switches 44 that enables control, address and data from Link1 to be applied to Bank1;

a Lnk_os_Bnk1_ctrl_enable 65 from switch controller 50 to switches 44 that enables control, address and data from Link0 to be applied to Bank1; and a Lnk1_Bnk_slct<1:0> output 66 from switch controller 50 to switch 46 used to select a bank when read related operation is performed from page buffer to link logic block for Link1.

For the purpose of this description, each bank has an "inside" link and an "outside" link. For this implementation, the inside link of a given bank is the link having a corresponding position to the bank, and the outside link is the remaining link. Thus, the inside link for Bank0 is Link0, and the outside link for Bank0 is Link1. The inside link for Bank1 is Link1, and the outside link for Bank1 is Link0. In the above labelling scheme, "Lnk_is" refers to a so-called "inside link", and "Lnk_os" refers to the so-called "outside link".

The switch controllers 48,50 receive the control inputs 49,51, and produce the control outputs Lnk_is_Bnk0_ctrl_enable 53, Lnk_os_Bnk0_ctrl_enable 60, Lnk0_Bnk_slct<1:0> 64, Lnk_is_Bnk1_ctrl_enable 63, Lnk_os_Bnk1_ctrl_enable 65, Lnk1_Bnk_slct<1:0> 66 in such a manner as to prevent prohibited combinations of link/bank accesses. Specifically, the two links are not permitted to access the same bank during overlapping time intervals, and the switch controllers 48, 50 operate to prevent this.

The data connections illustrated in FIG. 2 include the following data paths for read operation:

a Bank0 output 60 shown connected to each of switches 42,46; this output may be a parallel output, for example 4, 8 or 16 bits depending on a particular design, with parallel to conversion being performed in the Link blocks; alternatively, if there is a built-in parallel to serial converter in Bank0 for read access, then this output may be a serial output; the remainder of this description assumes it is a 8-bit parallel output;

a Bank1 output 62 shown connected to each of switches 42,46; similar comments apply with respect to this output as described above for output 62;

a connection 67 interconnecting switch 42 and Link0 10; and a connection 68 interconnecting switch 46 and Link1 12.

The connections illustrated in FIG. 2 include the following for control and write operation:

a plurality of outputs 70 from Link0 10 that are each connected to a respective switching element of switch 40, and a respective switching element of switch 44, a plurality of outputs 72 from Link1 12 that are each connected to a respective switching element of switch 40 and a respective switching element of switch 44, a respective output from each switching element of switch 40 connected to Bank0 10, the outputs collectively indicated at 74; and a respective output from each switching element of switch 44 connected to Bank1 12, the outputs collectively indicated at 76.

In operation, commands are received at Link0 10 and Link1 12, and each command will be associated with one of the banks. For Link0 10, the selected bank is indicated at Bnk0<1:0> 49 and this is propagated to switch controllers 48,50 while for Link1 12, the selected bank is indicated at Bnk1<1:0> 51 and this also is propagated to switch controllers 48,50. The switch controllers 48,50 operate to prevent contention for the same bank by multiple links. An access attempt that is does not result in contention for the same bank by multiple links is referred to as a valid access attempt. A detailed circuit for preventing invalid attempts is described further below.

In some embodiments, to switch the two links between the two banks effectively without performance degradation due to the additional logic paths, data transferring is carried out after serial data to parallel conversion through designated registers in each link 10,12 to produce the sets of outputs 70,72. An example of a detailed implementation showing the serial to parallel conversion will be described later with reference to FIG. 7.

With reference to FIG. 2, various access scenarios will now be described. The access scenarios described below include Link0 to Bank0 access, Link0 to Bank1 access, Link1 to Bank1 access, and Link1 to Bank0 access.

During a valid access attempt by Link0 10, if Bank0 18 is selected, then the switch controller 48 will control switches 40 such that outputs 70 of Link0 are propagated to Bank0 18 thereby establishing write data path and control path. Switch controller 48 will control switch 42 such that the output 60 from Bank0 18 is propagated along output 67 to Link0 10 thereby establishing read data path.

During a valid access attempt by Link0 10, if Bank1 20 is selected, then the switch controller 50 will control switches 44 such that outputs 70 of Link0 10 are propagated to Bank1 thereby establishing write data path and control path. Switch controller 50 will control switch 42 such that the output 62 from Bank1 20 is propagated along output 67 to Link0 10 thereby establishing read data path.

During a valid access attempt by Link1 12, if Bank1 20 is selected, then the switch controller 50 will control switches 44 such that outputs 72 of Link1 12 are propagated to Bank1 20 thereby establishing write data path and control path. Switch controller 50 will control switch 46 such that the output 62 from Bank1 20 is propagated along output 68 to Link1 12 thereby establishing read data path.

During a valid access attempt by Link1 12, if Bank0 18 is selected, then the switch controller 48 will control switches 40 such that outputs 72 of Link1 12 are propagated to Bank0 thereby establishing write data path and control path. Switch controller 50 will control switch 46 such that the output 60 from Bank0 18 is propagated along output 68 to Link1 12 thereby establishing read data path.

The various access scenarios described above are specific to the implementation shown in FIG. 2. Note that additional access scenarios might be possible if additional banks and/or links are present. Access scenarios may differ for different implementations. FIGS. 3 through 6 will be used to describe various access scenarios for an alternative implementation. In each figure, the control signals discussed previously are shown, namely:

Lnk0_Bank_slct<0> for Link0,
Lnk0_Bank_slct<1> for each Link0,
Lnk1_Bank_slct<0> for Link1,
Lnk1_Bank_slct<1> for each Link1,
Lnk_is_Bnk0_ctrl_enable,
Lnk_os_Bnk0_ctrl_enable,
Lnk_is_Bnk1_ctrl_enable, and
Lnk_os_Bnk1_ctrl_enable.

The various access scenarios described below include Link0 to Bank0 access, Link0 to Bank1 access, Link1 to Bank1 access, and Link1 to Bank0 access.

Figure 3:
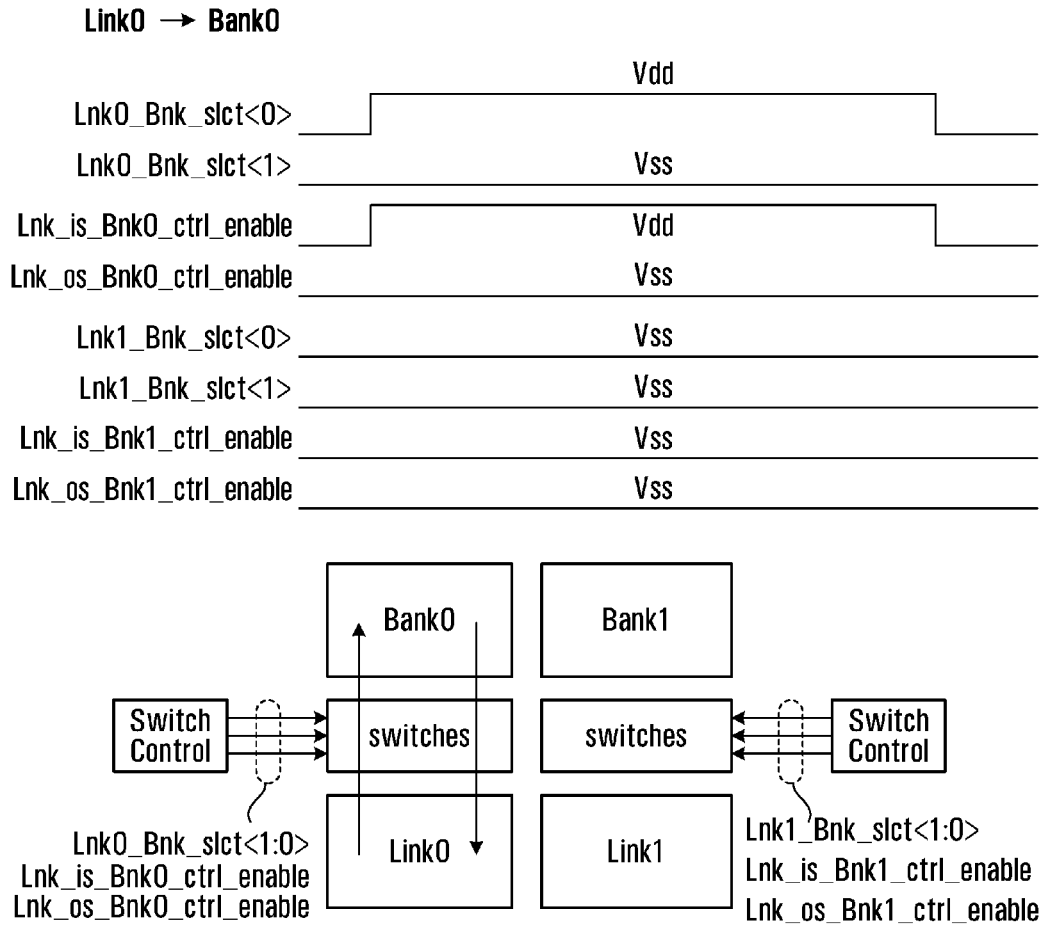
FIGS. 3 through 6 show various valid memory access configurations for the system of FIG. 2.

With reference to FIG. 3, shown is another example of Link0 to Bank0 access. Only Link0 control signals are involved in switching multiplexer between Link0 and Bank0. For this example, Link0 access to Bank0 access is an inside operation that does not need any signals from outside. The link select Lnk_is_Bnk0_ctrl_enable is enabled to allow data and control inputs from Link0 to be passed on to Bank0 and Lnk0_Bnk_slct<0> transitions to a high state thereby selecting Bank0 for read operations until a new command is asserted.

Figure 4:
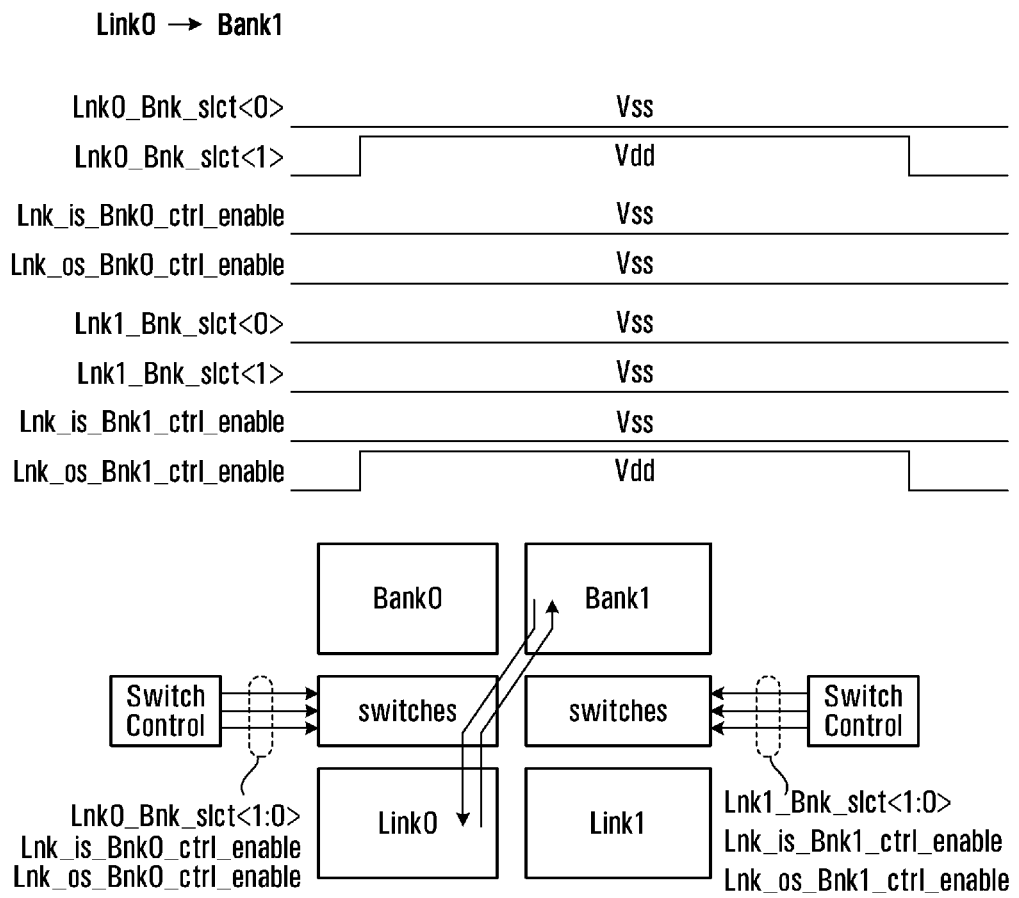

With reference to FIG. 4, there is a switch of the connection of Bank1 from Link1 to Link0 so that the high transition of Lnk_os_Bnk1_ctrl_enable occurs after obtaining bank information from SIP0 (link 0 port). Instead of Link1 connections, Link0 control signals are transferred to Bank1 via the switches placed between Bank1 and Link1. Lnk_os_Bnk0_ctrl_enable transitions to high to enable data and control inputs from Link0 to be passed to Bank1, and Lnk0_Bnk_slct<1> transitions to high to select Bank1 for read access.

Figure 5:
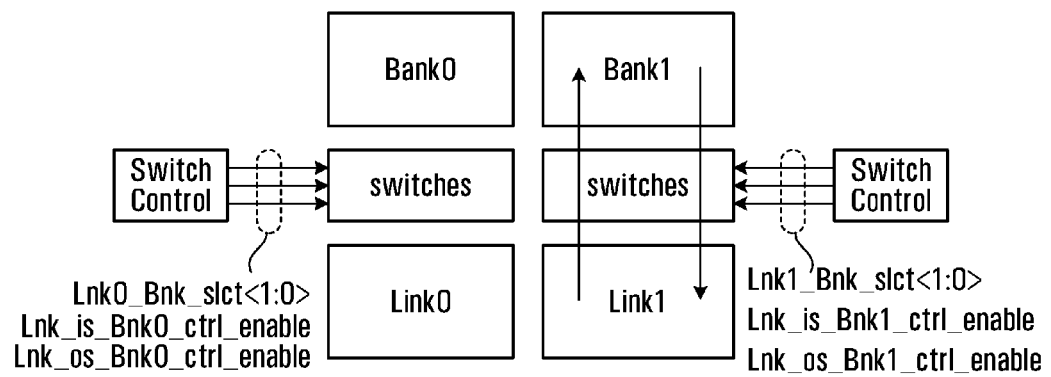

With reference to FIG. 5, shown is another example of Link1 to Bank1 access. The case of Link1 and Bank1 is similar to the Link0 and Bank0 example described with reference to FIG. 3. Without control and data path switching between Link0 (or Link1) and Bank1 (Bank0), all switches placed in the middle of Bank1 and Link1 pass data and control them to Bank1. Lnk_is_Bnk1_ctrl_enable transitions to high enable data and control inputs from Link1 to be passed to Bank1, and Lnk1_Bnk_slct<1> transitions to high to select Bank1 for read access.

Figure 6:
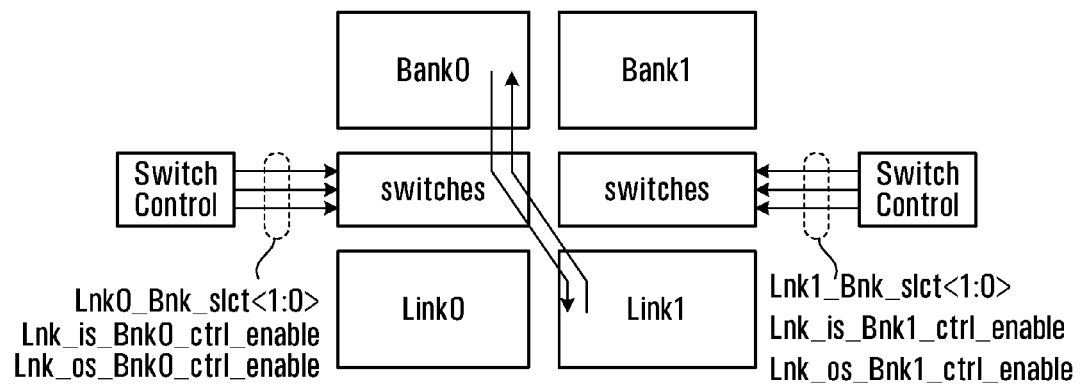

With reference to FIG. 6, shown is another example of Link1 to Bank0 access. For this example, there is a switch of the connection of Bank0 from Link0 to Link1 so that the high transition of Lnk_os_Bnk0_ctrl_enable occurs after obtaining bank information from SIP0 (link 0 port). Instead of Link0 connections, Link1 control signals are transferred to Bank0 via the switches placed between Bank0 and Link0. Lnk_os_Bnk_ctrl_enable transitions to high to enable data and control inputs from Link1 to be passed to Bank0, and Lnk1_Bnk_slct<1> transitions to high to select Bank0 for read access.

For the output result of a read operation, global data lines <7:0> are used to send data from the Page buffer to Link1. Lnk_os_Bnk0_ctrl_enable transitions to high to enable data and control inputs from Link1 to be passed on to Bank0, and Lnk_bnk_slct<0> transitions to high to select Bank0 for read access.

Figure 7:
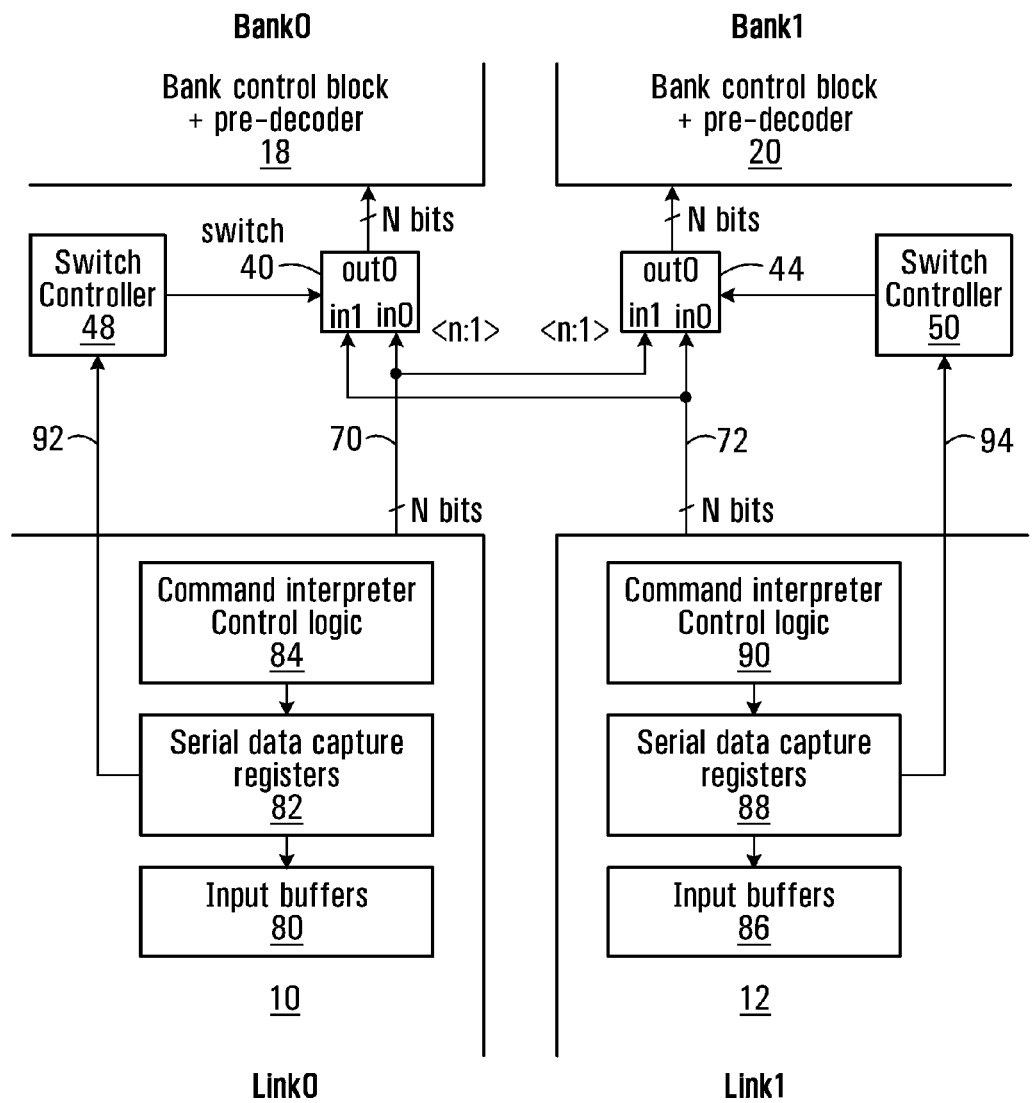
FIG. 7 is a block diagram showing details of the link controllers of FIG. 2.

Referring now to FIG. 7, an example of a detailed implementation for some of the functionality of FIG. 2 will be described. Again, Link0 10, Link1 12, Bank0 18 and Bank1 20 are shown. Switches 40,44 (individual switching elements are shown in FIG. 2) interconnect the links 10,12 to the banks 18,20 and are controlled by switch controllers 48,50. The outputs 70 of Link0 10 are connected to both switches 40,44, and the outputs 72 of Link1 are connected to both switches 40,44. In the example of FIG. 7, a control output 92 from Link0 10 is input to switch controller 48, and a control output 94 from Link1 12 is input to switch controller 50. Link0 10 has input buffers 80, serial data capture registers 82 that allows serial to parallel conversion, and command interpreter control logic 84. Similarly, Link1 12 has input buffers 86, serial data capture registers 88, and command interpreter control logic 90.

In order to catch the bank address from a SIP (Serial Input Port) (not shown) and generate the switch control signals described above, prior to the command assertion, a bank address is input first with a DN (device Number) to select which device (assuming a serial interconnected memory system). Based on the bank address, each link transfers data bits to a selected bank address bit. Switch logic delay is not negligible in the 2 banks and 2 links system. However, due to the timing margin between serial to parallel conversion at registers 82, the delay is hidden while input data is being latched consecutively. The command decoding in the command interpreter control logic 84 is performed after latching a bank address and making relevant control signals of switch logic so that any race timing issue between switch control signals and input data of switches does not occur. The switch logic can be varied according to the logic implementation. In the specific circuits described herein, 2-input NANDs are used to perform a multiplexing function.

Figure 8:
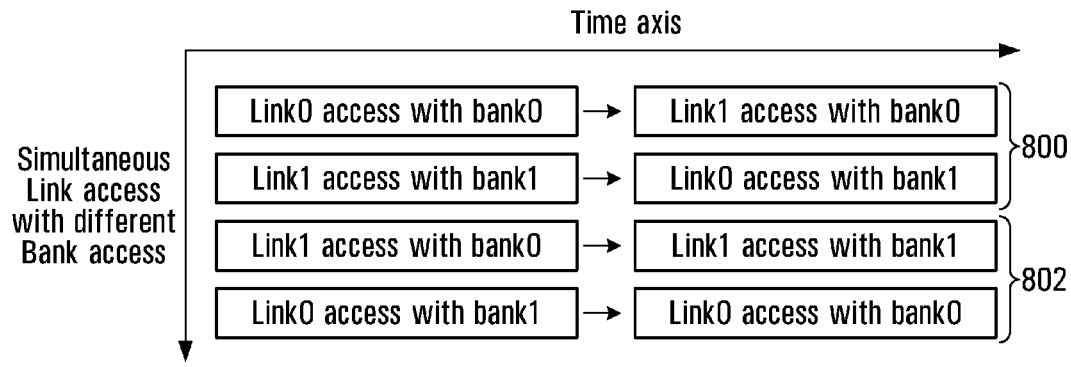
FIG. 8 shows a set of simultaneous link accesses with different banks that are valid.
Figure 9:
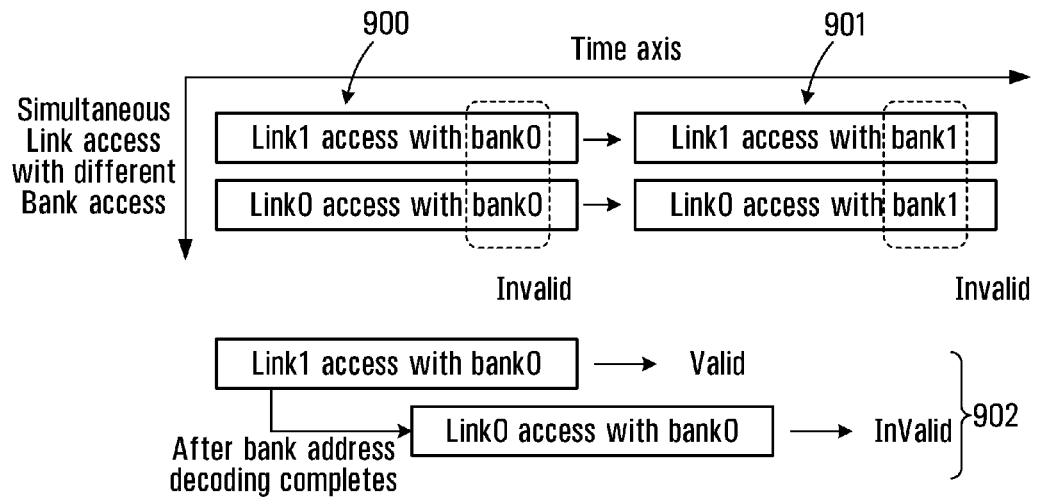
FIG. 9 shows two examples of linked bank accesses that are not valid.

The different links should have valid different bank access when two links are used without timing difference. This is shown by way of example in FIG. 8 where there is no timing difference between accesses to two banks. A first example is generally indicated at 800. In this example, there is valid simultaneous access by Link0 to Bank0 and Link1 to Bank1 followed by valid simultaneous access by Link1 to Bank0 and Link0 to Bank1. A second example is generally indicated at 802. In this example, there is valid simultaneous access by Link1 to Bank0 and Link0 to Bank1 followed by valid simultaneous access by Link1 to Bank1 and Link0 to Bank0. Another invalid access state occurs when there is simultaneous access to the same bank from two links. FIG. 9 shows an example of such an invalid access. In an example generally indicated at 900, both links are simultaneously attempting to access Bank0. In an example generally indicated at 901, both links are simultaneously attempting to access Bank1.

Banks are physically separated with dedicated logic blocks that activate the word line and bit line paths. Independent operations are achieved with flexible link and bank connections. Valid and invalid determination is made as a function of timing difference at the two links as shown in FIG. 9. If there is some difference between the timing of link operations for the same bank (i.e. not simultaneous as was the case with the examples of FIG. 8), then the first access is allowed, and the subsequent access is invalid and is ignored. The timing difference may be varied by PVT (Process/Voltage/Temperature). In some implementations, a timing difference of at least 2 cycles is used to ensure the valid operation of the first input streams from any link input port. The timing difference is implementation specific.

In summary, when there is a sequential access to the same bank from two links, the first access is valid, and the second is invalid. FIG. 9 shows an example of this, generally indicated at 902. There is a first valid access from Link1 to Bank0 followed by a later invalid access from Link0 to Bank0.

Figure 10:
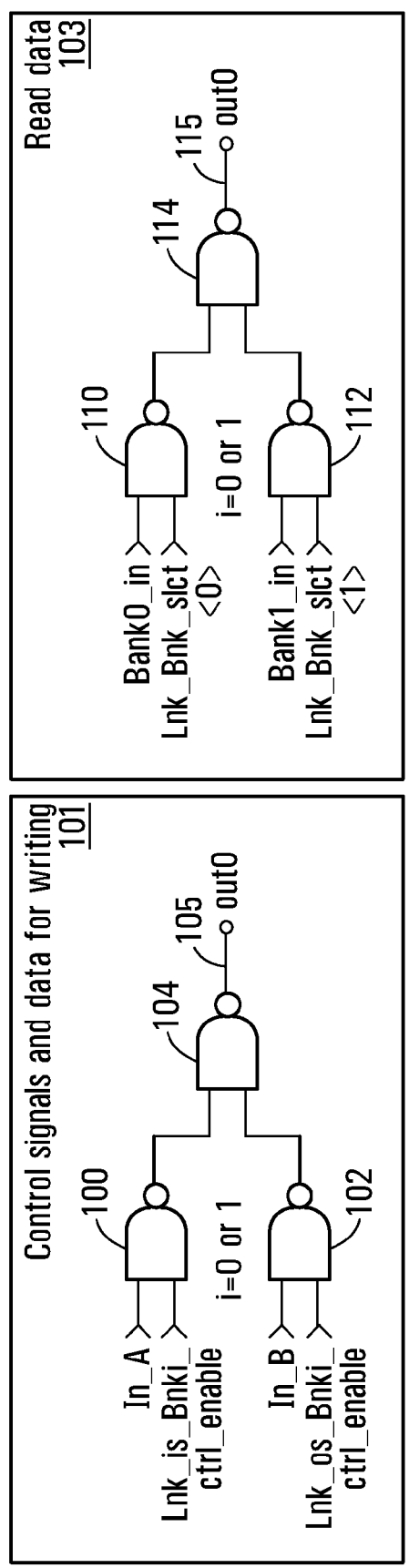
FIG. 10 shows switching elements for control and data, and for read data.

In FIG. 10, generally indicated at 101 is an example of a single switching element in switch 40 or switch 44. The switching element 101 has a first NAND gate 100 that receives an input In_A and also receives the link select signal Ink_is_Bnki_ctrl_enable (i=0 for switches controlled by switch controller 48 and i=1 for switching elements controlled by switch controller 50). Switching element 101 has a second NAND gate 102 that receives an input In_B from Link1 also receives the link select signal Lnk_os_Bnki_ctrl_enable (i=0 for switches controlled by switch controller 48 and i=1 for switching elements controlled by switch controller 50). For switching elements controlled by switch controller 48, i=0, so In_A is an input from Link0 and In_B is an input from Link1. For switching elements controlled by switch controller 50, i=1, so In_A is an input from Link1 and In_B is an input from Link0. The outputs of the two NAND gates 100,102 are input to a third NAND gate 104 which combines them to produce switch output out0 105. For switching elements controlled by switch 48, out0 105 is connected as an input to Bank0. For switching elements controlled by switch 50, out0 105 is connected as an input to Bank1.

In FIG. 10, generally indicated at 103 is an example of a single switching element in switch 42 or switch 46. The switching element 103 has a first NAND gate 110 that receives an input Bank0_in from Bank0 and also receives the bank select signal Lnk_Bnk_slct<0>. Switching element 103 has a second NAND gate 102 that receives an Bank1_in from Bank1 and also receives the bank select signal Lnk_Bnk_slct<1>. For switching elements controlled by switch controller 48, Lnk0_Bnk_slct<1:0> are in respect of link0. For switching elements controlled by switch controller 50, Lnk1_Bnk_slct<1:0> are in respect of Link1. The outputs of the two NAND gates 110,112 are input to a third NAND gate 114 which combines them to produce switch output out1 115. For switch 48, out0 115 is connected as an input to link0. For switch 50, out0 115 is connected as an input to Link1.

The switching elements 101,103 are shown with specific logic components. In other implementations, the switching elements 101,103 have alternative logic components that in combination achieve similar functionality. The switching elements 101,103 need not have any NAND gates. Other implementations are possible.

In some embodiments, the system has an additional input, for example an extra input pin, that enables identical switch controller circuitry to be implemented for the switch control logic for all of the links. Such an input can be used to identify the link the switch control logic is functioning for.

Figure 11A:
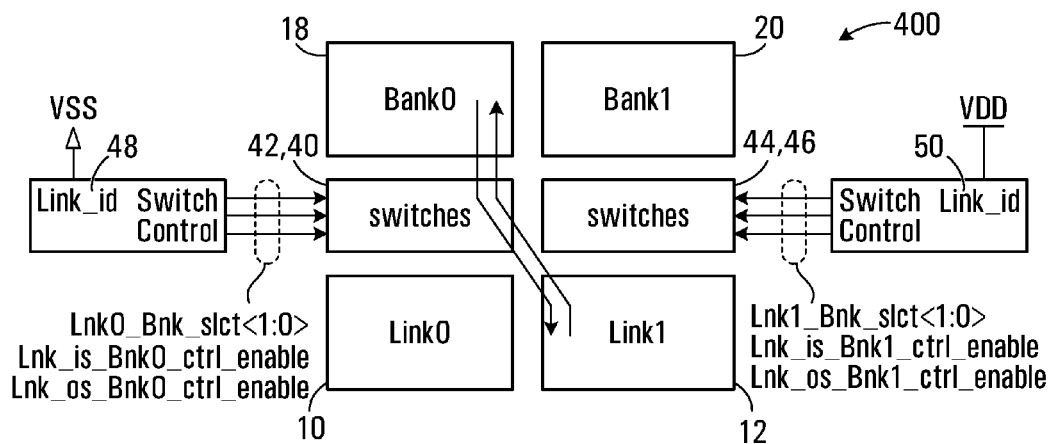
FIG. 11A is a block diagram showing the use of a link_ID to configure switch controllers.

A summary of the logic for the purpose of illustrating link_id functionality is indicated at 400 in FIG. 11A. Again Link0 12, Link1 12, Bank0 18, Bank1 20, and switches 42,44, 46,48 are shown. Switch controller 48 is with a link_id connected to VSS, thereby selecting it to function as the switch controller for Link0 10. The switch controller 48 produces Lnk0_Bnk_slct<1:0>, and produces Lnk_is_Bnk0_ctrl_enable and Lnk_os_Bnk01_ctrl enable [p24]. Switch controller 50 is with a link_id connected to VDD, thereby selecting it to function as the switch controller for Link1 12. The switch controller 50 produces Lnk1_Bnk_slct<1:0>, and produces Lnk_os_Bnk0_ctrl_enable and Lnk_is_Bnk1_ctrl enable.

In some embodiments, the system has an additional input, for example an extra input pin, that allows a selection between single link configuration and multiple link configuration. In a specific example included in FIG. 12 below, a Single_link input is implemented. If single link configuration is used, this pin is high. For multiple link configuration (dual link in the illustrated example), the pin is set low.

Figure 11B:
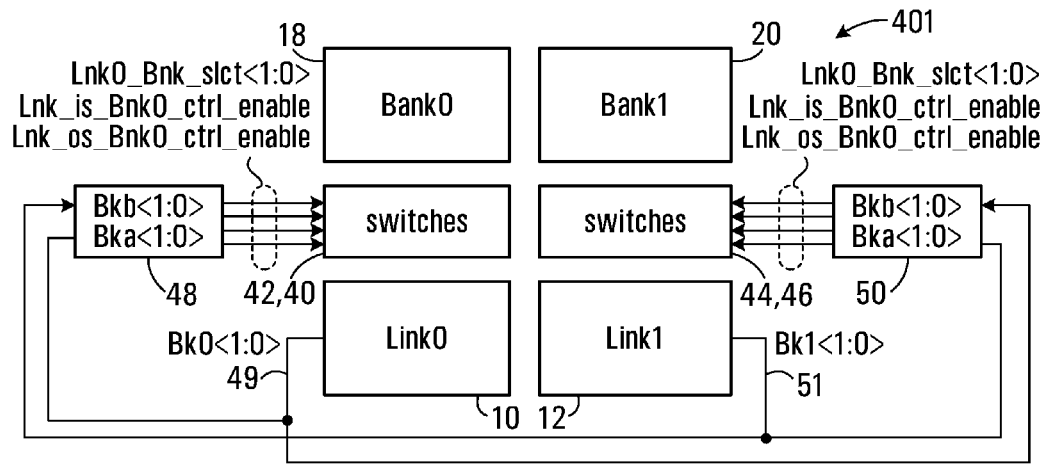
FIG. 11B is a block diagram showing the interconnection of bank select signals between link controllers and switch controllers.

An example of the logic for the purpose of illustrating bank select interconnections is indicated at 401 in FIG. 11B. Again Link0 10, Link1 12, Bank0 18, Bank1 20, and switches 42,44, 46,48 are shown. As described previously, Link0 outputs bank select signals Bk0<1:0> 49 while Link1 outputs bank select signals Bk1<1:0> 51. Each switch controller 48,50 has inputs for receiving Bkb<1:0> and Bka<1:0>. The suffix 'a' and 'b' of 'Bka<1:0>' and 'Bkb<1:0>' have the meaning of two different links, and <1:0> is bank number, with <0>→Bank0 and <1>→Bank1. The connection of these inputs to the bank select outputs of link0, Link1 is done according to the location of the logic system. Specifically, for switch controller 48 (link0 side), Bka<1:0>=Bk0<1:0> and Bkb<1:0>=Bk1<1:0>. For switch controller 50 (link1 side), the connections are reversed such that Bka<1:0>=Bk1<1:0> and Bkb<1:0>=Bk0<1:0>.

Figure 12:
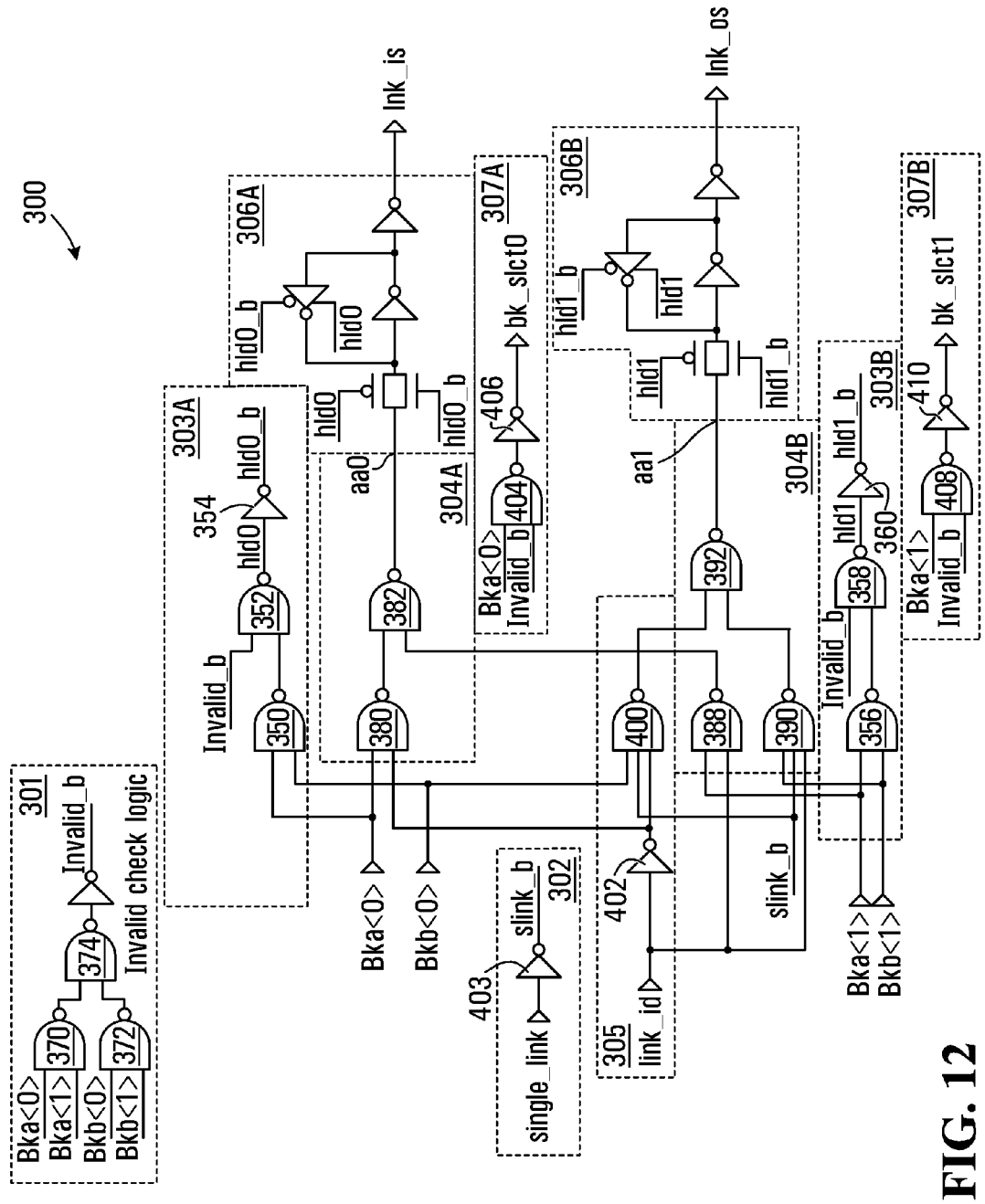
FIG. 12 is a detailed block diagram of a switch controller.

A detailed diagram of an example implementation of the switch controllers is shown in FIG. 12. It is to be understood that this implementation is very specific for example purposes only. The particular example illustrated is designed to allow it to function as a switch controller for the switches connected to/from any of the banks. The circuitry generally indicated at 300 generates four control signals Ink_is, Ink_os, bk_slct0 and bk_slct1, which are used to open and close the switches that connect the links to the banks. These switches may be implemented using any appropriate logic circuitry, for example circuitry having 2-input NAND gates as shown in FIG. 10.

Link recognition logic 305 receives a link_id input. For example, if this logic system is included in link0 block, it is 'zero', otherwise, it is 'one'. This logic allows the circuit 300 to recognize which link control block contains itself when switch control operation starts. The link recognition logic has an inverter 402 that is connected to receive the link_id input. The output of inverter 402 is input to one input of a three input NAND gate 400. The other inputs of NAND gate 400 include the single link output slink_b, and Bkb<0>.

In operation, when the circuit 300 is configured to operate as switch controller 48 of FIG. 2 (link_id=0), output signals Ink_is and Ink_os function as Lnk_is_Bnk0_ctrl_enable and Ink_os_Bnk0_ctrl_enable for switch controller 48, and the other two outputs bk_slct0 and bk_slct1 are the Lnk0_Bnk_slct<1:0> signals of switch controller 48. When the circuit 300 is configured to operate as switch controller 50 of FIG. 2 (link_id=1), the two output signals Ink_is and Ink_os function as Lnk_is_Bnk1_ctrl_enable and Lnk_os_Bnk1_ctrl_enable for switch controller 50, and the other two outputs bk_slct0 and bk_slct1 are the Lnk1_Bnk_slct<1:0> signals switch controller 50.

The circuit includes a first Invalid check logic 301. This logic is provided to prevent two bank access through one link at the same time. The circuit has first NAND gate 370 that has inputs Bka<0> AND Bka<1>, and a second NAND gate 372 that has inputs Bkb<0> AND Bkb<1>. The outputs of the two NAND gates 370,372 are input to a third NAND gate 374 the output of which is inverted with an inverter to produce an invalid_b output.

In operation, the Invalid check logic 301 produces an Invalid_b output that is high if both banks are selected by one link. Specifically, if Bka<0> AND Bka<1> are both high meaning both banks are selected by the same link, then the Invalid_b output is high indicating an invalid condition; if Bkb<0> AND Bkb<1> are both high meaning both banks are selected by the same link, then the Invalid_b output is high indicating an invalid condition.

If two inputs (Bka<0> and Bka<1>) or (Bkb<0> or Bkb<1>) have zero states, this means there is no operation since there is no selection of banks for the given link.

Single Link configuration circuit 302 is provided to allow the previously discussed selection of single link operation. Even though two links are more efficient for a two-bank memory system, single link also is supported as an available configuration of the memory system with the circuit described. If single link configuration is used, 'single_link' signal becomes high and 'slink_b' will have a low state. When 'slink_b' has a low state, 'Ink_os' becomes low and only 'Ink_is' has a valid state according to the bank address. For the two link configuration, 'single_link' has a low state such that both outputs 'Ink_is' and 'Ink_os' are valid. In the illustrated example, single link configuration circuit 302 is simply an inverter 403.

The circuit 300 has a second Invalid check logic that includes functionality indicated at 303A and 303B. Circuit 303A has a NAND gate 350 that receives Bka<0> and Bkb<0>. The output of the NAND gate 350 is connected to an input of another NAND gate 352 that also receives the previously referenced Invalid_b. The output hld0 of the NAND gate 352 is inverted by inverter 354 to produce output hld0_b. Circuit 303B has a NAND gate 356 that receives Bka<1> and Bkb<1>. The output of the NAND gate 356 is connected to an input of another NAND gate 358 that also receives the previously referenced Invalid_b. The output hld1 of the NAND gate 358 is inverted by inverter 360 to produced output hld1_b.

In operation, these circuits 303A,303B provide a data holding function to keep the previous state of Ink_is and Ink_os respectively when two links access the same bank at the same time, accidentally and when a single link attempts to access both banks simultaneously (as signalled by Invalid_b). For circuit 303A, if both of the inputs Bka<0> and Bkb<0> have 'zero' states or one of inputs has 'zero' state, the outputs hld0 and hld0_b have high and low state, respectively. If both of the inputs Bka<0> and Bkb<0> have 'one' states, the outputs hld0 and hld0_b have low and high state, respectively. This occurs if both links are trying to access Bank0. This is a hold state that also occurs if the same link is attempting to access both banks as indicated by the Invalid_b input. The hld0 and hld0_b outputs are used by hold logic 306A to hold Ink_is to a previous value as described in further detail below.

In circuit 303B, if Bka<1> and Bkb<1> both have 'zero' states or one of inputs has 'zero' state, the outputs hld1 and hld1_b have high and low state, respectively. Similarly, if both Bka<1> and Bkb<1> both have 'one' states, the outputs hld1 and hld1_b have low and high state, respectively. This occurs if both links are trying to access Bank1. This is a hold state that also occurs if the same link is attempting to access both banks as indicated by the Invalid_b input. The hld0 and hld0_b outputs are used by hold logic 306B to hold Ink_os to a previous value as described in further detail below.

Switch logic 304A, 304B functions to control the logic as a function of the link_id. In case of Link0, link_id is zero so that the output of inverter 402 is high and enables NAND gate 380. When this is the case, then Bka<0>, actually, BK0<0>, becomes the input source of Ink_is. On the other hand, in the case of Link1, link_id is high and this enables NAND gate 388 such that Bka<1>, actually BK1<1>, becomes the input source of Ink_is. The operation of switching logic 304A, 304B can be summarized as follows:

Link0 position (link_id=0)→NAND 380 output affects the result of 'Ink_is', NAND 388 logically does not have any influence. The result is bank 0 access from link 0→link inside (304A).

Link1 position (link_id=1)→NAND 388 output affects the result of 'Lnk_is'. NAND 380 logically does not have any influence. The result is bank 1 access from link 1→link inside (304A).

Link0 position (link_id=0) NAND 400 output affects the result of 'Ink_os'.→Bk1<0> is logically connected to the NAND 392 as one of inputs. The result is bank 0 access from link 1→link outside (304B).

Link1 position (link_id=1) NAND 390 output affects the result of 'Ink_os'.→Bk0<1> is logically connected to the NAND 392 as one of inputs. The result is bank 1 access from link 0→link outside (304B).

Switch logic 304A has a first NAND gate 380 that receives Bka<0> and the inverted link_id. The output of NAND gate 380 is connected as an input to NAND gate 382. The second input of NAND gate 382 comes from the output of a NAND gate 388 forming part of switch logic 304B described below. The overall output of switch logic 304A is labelled aa0.

Switch logic 304B has a first NAND gate 388 that receives Bka<1> and the link_id. The output of NAND gate 388 is connected as an input to NAND gate 382 forming part of switch logic 304A described above. Logic 304B also includes a second NAND gate 390 that has three inputs: Bkb<1>, slink_b and link_id. The output of NAND gate 390 is input to a third NAND gate 392 having a second input received from the output of NAND gate 400 forming part of link recognition logic 305. The overall output of switch logic 304B is labelled aa1.

Switch logic 304A,304B functions according to the truth table in FIG. 13 for two link operation and according to the truth table in FIG. 14 for single link operation. In FIG. 13, the top half 1300 of the table represents behaviour for Link_id=0, while the bottom half 1302 of the table represents behaviour for Link_id=1. The output of logic 304A is referred to as aa0, while the output of logic 304B is referred to as aa1. The output is either "0" meaning deselect, "1" meaning select, or "Hold" meaning maintain previous output. Note that the logic combinations not shown in FIG. 13 relate to invalid cases that are prevented by invalid check logic.

Hold circuit 306A functions to receive the output aa0 of switch logic 304A and to pass this on to the output Ink_is unless the hld0 is low and hld0_b are high in which case Ink_is holds its previous state. Similarly, Hold circuit 306B functions to receive the output aa1 of switch logic 304B and to pass this on to the output lnk_os unless the hld0 is low and hld0_b are high in which case lnk_os holds its previous state.

Finally, there is bank selection logic 307A,307B for the read data path. This logic is used to select which bank is now connected to the accessed link control block. Logic 307A has a NAND gate 404 that receives Bka<0> and Invalid_b as inputs. The output of NAND gate 404 is inverted by inverter 406 to produce bk_slct0. Logic 307B has a NAND gate 408 that receives Bka<1> and Invalid_b as inputs. The output of NAND gate 408 is inverted by inverter 410 to produce bk_slct1.

In operation, other when there is an invalid state signalled by Invalid check logic 301, Bka<0> and Bka<1> logic values are passed by the circuit to 'bk_slct0' and 'bk_slct1' output ports. The outputs bk_slct0 and bk_slct1 are the Lnk_Bnk_slct<1:0> signals of one of the switch controllers 48,50.

In the embodiments described above, the device elements and circuits are connected to each other as shown in the figures, for the sake of simplicity. In practical applications of the present invention, elements, circuits, etc. may be connected directly to each other. As well, elements, circuits etc. may be connected indirectly to each other through other elements, circuits, etc., necessary for operation of devices and apparatus. Thus, in actual configuration, the circuit elements and circuits are directly or indirectly coupled with or connected to each other.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A memory device comprising:
    a first link and a second link;
    a first bank and a second bank;
    switching circuitry configured to switch data between the first bank, the second bank, the first link, and the second link, the switching circuitry comprising:
    a first switching logic circuit comprising:
        a first input for receiving a data input from the first link;
        a second input for receiving an enable for writing for the first link;
        a third input for receiving a data input from the second link;
        a fourth input for receiving an enable for writing for the second link;
        an output for outputting data to a memory bank.

2. The memory device of claim 1 further comprising:
    a second switching logic circuit comprising:
        a first input for receiving a data input from the first bank;
        a second input for receiving an enable for reading from the first bank;
        a third input for receiving a data input from the second bank;
        a fourth input for receiving an enable for reading from the second bank;
        an output for outputting data read from the first or second bank.

3. The memory device of claim 1 wherein the first switching logic circuit comprises:
    a first NAND gate connected to the first input of the first switching logic circuit for receiving data from the first link and the second input of the first switching logic circuit for receiving the enable for writing for the first link;
    a second NAND gate connected to the third input of the first switching logic circuit for receiving data from the second link and the fourth input of the first switching logic circuit for receiving the enable for writing for the second link;
    a third NAND gate connected to an output of the first NAND gate and an output of the second NAND gate to produce the output of the first switching logic circuit.

4. The memory device of claim 2 wherein the second switching logic circuit comprises:
    a first NAND gate connected to the first input of the second switching logic circuit for receiving data from the first bank and the second input of the second switching logic circuit for receiving the enable for reading from the first bank;
    a second NAND gate connected to the third input of the second switching logic circuit for receiving data from the second bank and the fourth input of the second switching logic circuit for receiving the enable for reading from the second bank;
    a third NAND gate connected to an output of the first NAND gate and an output of the second NAND gate to produce the output of the second switching logic circuit.

5. The memory device of claim 3 further comprising:
    a second switching logic circuit comprising:
        a first input for receiving a data input from the first bank;
        a second input for receiving an enable for reading from the first bank;
        a third input for receiving a data input from the second bank;
        a fourth input for receiving an enable for reading from the second bank;
        an output for outputting data read from the first or second bank;
    wherein the second switching logic circuit comprises:
        a fourth NAND gate connected to the first input of the second switching logic circuit for receiving data from the first bank and the second input of the second switching logic circuit for receiving the enable for reading from the first bank;
        a fifth NAND gate connected to the third input of the second switching logic circuit for receiving data from the second bank and the fourth input of the second switching logic circuit for receiving the enable for reading from the second bank;
        a sixth NAND gate connected to an output of the first NAND gate and an output of the second NAND gate to produce the output of the second switching logic circuit.

6. The memory device of claim 1 comprising:
    a first plurality of said first switching logic circuits, each being configured to receive respective data from the first link, the enable for writing for the first link, respective data from the second link, and the enable for writing for the second link; and each of the first plurality of said first switching logic circuits having a respective output for outputting data to the first bank.

7. The memory device of claim 1 comprising:
    a plurality of said first switching logic circuits, each being configured to receive respective data from the first link, the enable for writing for the first link, respective data from the second link, and the enable for writing for the second link, and each having a respective output for outputting data to the second bank.

8. The memory device of claim 6 further comprising:
    a second plurality of said first switching logic circuits each receiving respective data from the first link, the enable for writing for the first link, respective data from the second link, and the enable for writing for the second link, and each having a respective output for outputting data to the second bank.

9. The memory device of claim 2 comprising two of said second switching logic circuits wherein the output of a first of the two second switching logic circuits is for the first link, and the output of a second of the two second switching logic circuits is for the second link.

10. The memory device of claim 1 wherein each link comprises:
an input buffer configured to receive incoming command and data via at least one input of the link controller;
a converter configured to convert incoming command and data to parallel form; and
a command interpreter configured to interpret incoming commands.

11. The memory device of claim 2 comprising:
a first plurality of said first switching logic circuits each receiving respective data from the first link, the enable for writing for the first link, respective data from the second link, and the enable for writing for the second link, and each having a respective output for outputting data to the first bank;
a second plurality of said first switching logic circuits each receiving respective data from the first link, the enable for writing for the first link, respective data from the second link, and the enable for writing for the second link, and each having a respective output for outputting data to the second bank;
two of said second switching logic circuits wherein the output of a first of the two second switching logic circuits is for the first link, and the output of a second of the two second switching logic circuits is for the second link.

12. A memory device comprising:
a first link and a second link;
a first bank and a second bank;
switching circuitry configured to switch data between the first bank, the second bank, the first link, and the second link, the switching circuitry comprising:
a switching logic circuit comprising:
a first input for receiving a data input from the first bank;
a second input for receiving an enable for reading from the first bank;
a third input for receiving a data input from the second bank;
a fourth input for receiving an enable for reading from the second bank;
an output for outputting data read from the first or second bank.

13. The memory device of claim 12 wherein the switching logic circuit comprises:
a first NAND gate connected to the first input of the switching logic circuit for receiving data from the first bank and the second input of the switching logic circuit for receiving the enable for reading from the first bank;
a second NAND gate connected to the third input of the switching logic circuit for receiving data from the second bank and the fourth input of the switching logic circuit for receiving the enable for reading from the second bank;
a third NAND gate connected to an output of the first NAND gate and an output of the second NAND gate to produce the output of the switching logic circuit.

14. The memory device of claim 12 comprising two of said switching logic circuits wherein the output of a first of the two switching logic circuits is for the first link, and the output of a second of the two switching logic circuits is for the second link.

15. The memory device of claim 12 wherein each link comprises:
an input buffer configured to receive incoming command and data via at least one input of the link controller;
a converter configured to convert incoming command and data to parallel form; and
a command interpreter configured to interpret incoming commands.

* * * * *